United States Patent
Ebigase et al.

(10) Patent No.: US 9,219,224 B2
(45) Date of Patent: Dec. 22, 2015

(54) METHOD FOR MANUFACTURING PIEZOELECTRIC SUBSTRATE

(71) Applicant: NGK INSULATORS, LTD., Nagoya-Shi (JP)

(72) Inventors: Takashi Ebigase, Nagoya (JP); Tomohiko Hibino, Nagoya (JP)

(73) Assignee: NGK Insulators, Ltd., Nagoya-Shi (JP)

(*) Notice: Subject to any disclaimer, the term of this patent is extended or adjusted under 35 U.S.C. 154(b) by 150 days.

(21) Appl. No.: 14/041,114

(22) Filed: Sep. 30, 2013

(65) Prior Publication Data

US 2014/0068904 A1    Mar. 13, 2014

Related U.S. Application Data

(63) Continuation of application No. PCT/JP2012/058129, filed on Mar. 28, 2012.

(30) Foreign Application Priority Data

Mar. 30, 2011    (JP) .................................. 2011-076265

(51) Int. Cl.
*H01L 41/187* (2006.01)
*C04B 35/491* (2006.01)
(Continued)

(52) U.S. Cl.
CPC .............. *H01L 41/39* (2013.01); *C04B 35/486* (2013.01); *C04B 35/491* (2013.01); *C04B 35/493* (2013.01); *C04B 35/64* (2013.01); *H01L 41/1876* (2013.01); *H01L 41/43* (2013.01); *C04B 2235/3213* (2013.01);
(Continued)

(58) Field of Classification Search
CPC .............. C04B 35/493; C04B 2235/94; H01L 41/1876; H01L 41/871
See application file for complete search history.

(56) References Cited

U.S. PATENT DOCUMENTS

| | | |
|---|---|---|
| 5,279,996 A | 1/1994 | Hase et al. |
| 5,759,934 A | 6/1998 | Matoba |

(Continued)

FOREIGN PATENT DOCUMENTS

| | | |
|---|---|---|
| EP | 0 715 360 B1 | 9/1999 |
| JP | 05-124872 A1 | 5/1993 |

(Continued)

OTHER PUBLICATIONS

International Search Report and Written Opinion dated May 1, 2012.

*Primary Examiner* — Carol M Koslow
(74) *Attorney, Agent, or Firm* — Burr & Brown, PLLC (57) ABSTRACT

The method for manufacturing a piezoelectric substrate includes a process of forming a material having composition $M_{1-y/2+x}(N_{1-y}Nb_y)O_{3+x}$ (where $0 \leq y \leq 0.045$, M represents $Pb_{1-p}Sr_p$ with $0 \leq p \leq 0.03$, and N represents $Ti_{1-q}Zr_q$ with $0.45 \leq q \leq 0.60$) into a sheet form, and a process of burning the material formed into the sheet form while mounted on a setter to obtain a piezoelectric substrate. A thickness of the piezoelectric substrate is 30 μm or less, and a surface area/thickness ratio of the piezoelectric substrate is $1 \times 10^7$ μm or more. The variable x has a value within or on a boundary of a region R shown by hatching in FIG. 1.

2 Claims, 7 Drawing Sheets

(51) Int. Cl.
*H01L 41/39* (2013.01)
*H01L 41/43* (2013.01)
*C04B 35/493* (2006.01)
*C04B 35/64* (2006.01)
*C04B 35/486* (2006.01)

(52) U.S. Cl.
CPC ............... *C04B 2235/3251* (2013.01); *C04B 2235/3255* (2013.01); *C04B 2235/72* (2013.01); *C04B 2235/725* (2013.01); *C04B 2235/728* (2013.01); *C04B 2235/761* (2013.01); *C04B 2235/765* (2013.01); *C04B 2235/94* (2013.01); *C04B 2235/9623* (2013.01); *C04B 2235/9638* (2013.01); *Y10T 29/42* (2015.01)

(56) References Cited

U.S. PATENT DOCUMENTS

| | | | |
|---|---|---|---|
| 7,161,284 B2 * | 1/2007 | Ebigase et al. | 310/358 |
| 2005/0006620 A1 | 1/2005 | Helke | |
| 2006/0014038 A1 | 1/2006 | Sasaki | |
| 2008/0231667 A1 * | 9/2008 | Arakawa et al. | 347/71 |
| 2011/0289744 A1 | 12/2011 | Ohnishi et al. | |

FOREIGN PATENT DOCUMENTS

| | | |
|---|---|---|
| JP | 08-178549 A1 | 7/1996 |
| JP | 08-283069 A1 | 10/1996 |
| JP | 09-071476 A1 | 3/1997 |
| JP | 2737532 B2 | 4/1998 |
| JP | 3087644 B2 | 9/2000 |
| JP | 3119101 B2 | 12/2000 |
| JP | 2001-272178 A1 | 10/2001 |
| JP | 2003-055045 A1 | 2/2003 |
| JP | 2004-284900 A1 | 10/2004 |
| JP | 2005-170769 A1 | 6/2005 |
| JP | 2005-213117 A1 | 8/2005 |
| JP | 2006-008497 A1 | 1/2006 |
| JP | 2006-193415 A1 | 7/2006 |
| JP | 2007-084357 A1 | 4/2007 |
| JP | 2007-230811 A1 | 9/2007 |
| JP | 2010-037121 A1 | 2/2010 |
| JP | 2010-093598 A1 | 4/2010 |
| JP | 2011-009269 A1 | 1/2011 |
| JP | 2011-011923 A1 | 1/2011 |
| JP | 2011-057550 A1 | 3/2011 |
| WO | 2011/148969 A1 | 12/2011 |

* cited by examiner

| x | -0.0045 | -0.0030 | -0.0015 | 0.0000 | 0.0015 | 0.0030 | 0.0045 | 0.0060 |
|---|---|---|---|---|---|---|---|---|
| c/a | ○ | ○ | ○ | × | × | × | × | × |
| Adhesion | × | ○ | ○ | ○ | ○ | ○ | ○ | ○ |

(b) y=0.005

| x | -0.0045 | -0.0030 | -0.0015 | 0.0000 | 0.0015 | 0.0030 | 0.0045 | 0.0060 |
|---|---|---|---|---|---|---|---|---|
| c/a | ○ | ○ | ○ | ○ | ○ | × | × | × |
| Adhesion | × | ○ | ○ | ○ | ○ | ○ | ○ | ○ |

(c) y=0.010

| x | -0.0045 | -0.0030 | -0.0015 | 0.0000 | 0.0015 | 0.0030 | 0.0045 | 0.0060 |
|---|---|---|---|---|---|---|---|---|
| c/a | ○ | ○ | ○ | ○ | ○ | ○ | ○ | × |
| Adhesion | × | × | ○ | ○ | ○ | ○ | ○ | ○ |

(d) y=0.015

| x | -0.0045 | -0.0030 | -0.0015 | 0.0000 | 0.0015 | 0.0030 | 0.0045 |
|---|---|---|---|---|---|---|---|
| c/a | ○ | ○ | ○ | ○ | ○ | ○ | × |
| Adhesion | × | × | ○ | ○ | ○ | ○ | ○ |

(e) y=0.0225

| x | -0.0045 | -0.0030 | -0.0015 | -0.0010 | 0.0000 | 0.0015 | 0.0030 | 0.0045 |
|---|---|---|---|---|---|---|---|---|
| c/a | ○ | ○ | ○ | ○ | ○ | ○ | ○ | × |
| Adhesion | × | × | ○ | ○ | ○ | ○ | ○ | ○ |

(f) y=0.030

| x | -0.0045 | -0.0030 | -0.0015 | -0.0010 | 0.0000 | 0.0015 | 0.0030 | 0.0045 |
|---|---|---|---|---|---|---|---|---|
| c/a | ○ | ○ | ○ | ○ | ○ | ○ | × | × |
| Adhesion | × | × | × | ○ | ○ | ○ | ○ | ○ |

(g) y=0.0375

| x | -0.0045 | -0.0030 | -0.0015 | -0.0010 | 0.0000 | 0.0010 | 0.0020 | 0.0030 | 0.0045 |
|---|---|---|---|---|---|---|---|---|---|
| c/a | ○ | ○ | ○ | ○ | ○ | ○ | × | × | × |
| Adhesion | × | × | × | ○ | ○ | ○ | ○ | ○ | ○ |

(h) y=0.045

| x | -0.0045 | -0.0030 | -0.0015 | -0.0010 | 0.0000 | 0.0015 | 0.0030 | 0.0045 |
|---|---|---|---|---|---|---|---|---|
| c/a | ○ | ○ | ○ | ○ | ○ | × | × | × |
| Adhesion | × | × | × | ○ | ○ | ○ | ○ | ○ |

METHOD FOR MANUFACTURING PIEZOELECTRIC SUBSTRATE

CROSS-REFERENCE TO RELATED APPLICATION

This is a Continuation of International Application No. PCT/JP2012/058129 filed on Mar. 28, 2012, which claims priority to Japanese Patent Application No. 2011-076265 filed on Mar. 30, 2011, the disclosure of which is hereby incorporated by reference herein in its entirety.

BACKGROUND OF THE INVENTION

1. Technical Field

The technique disclosed in this specification relates to a method for manufacturing a piezoelectric substrate.

2. Description of Related Art

Various methods have been proposed as methods for manufacturing a piezoelectric substrate. For example, in Japanese Patent Application Publication 2007-084357, a technique is disclosed for burning a piezoelectric substrate using a setter made of $ZrO_2$ with added Ca.

SUMMARY OF THE INVENTION

Over time, demand for a thin piezoelectric substrate has been increasing, and in recent years a demand has arisen for a piezoelectric substrate of thickness 30 μm or less. However, as yet, no suitable method for manufacturing a piezoelectric substrate of thickness 30 μm or less has been established. Accordingly, in this specification, a manufacturing method is provided that is capable of appropriately manufacturing a piezoelectric substrate of thickness 30 μm or less.

Figure 6:
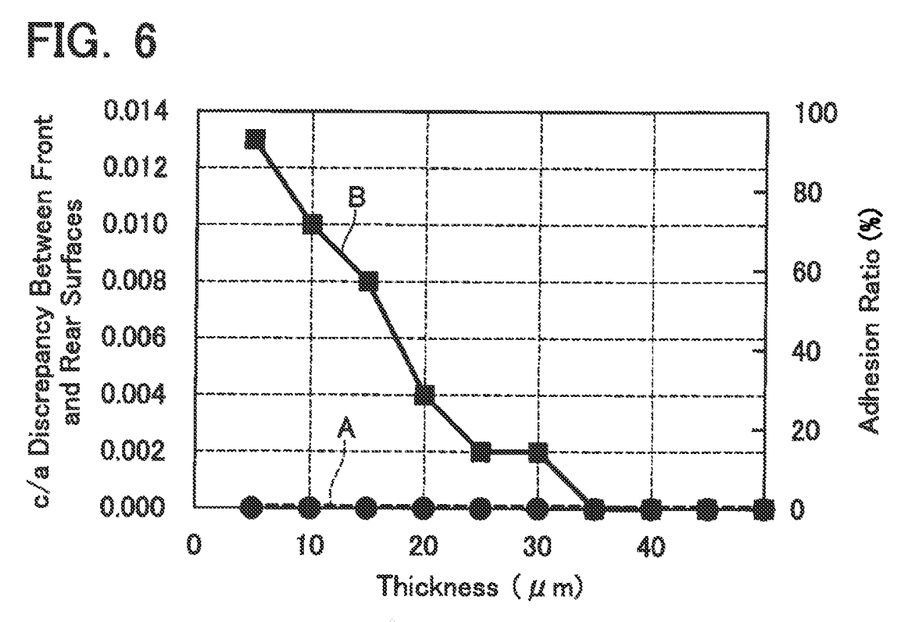
FIG. 6 is a figure showing evaluation results for $Pb_{1-y/2+x}(N_{1-y}Nb_y)O_{3+x}$ (where x=0.045 and y=0.020)
Figure 7:
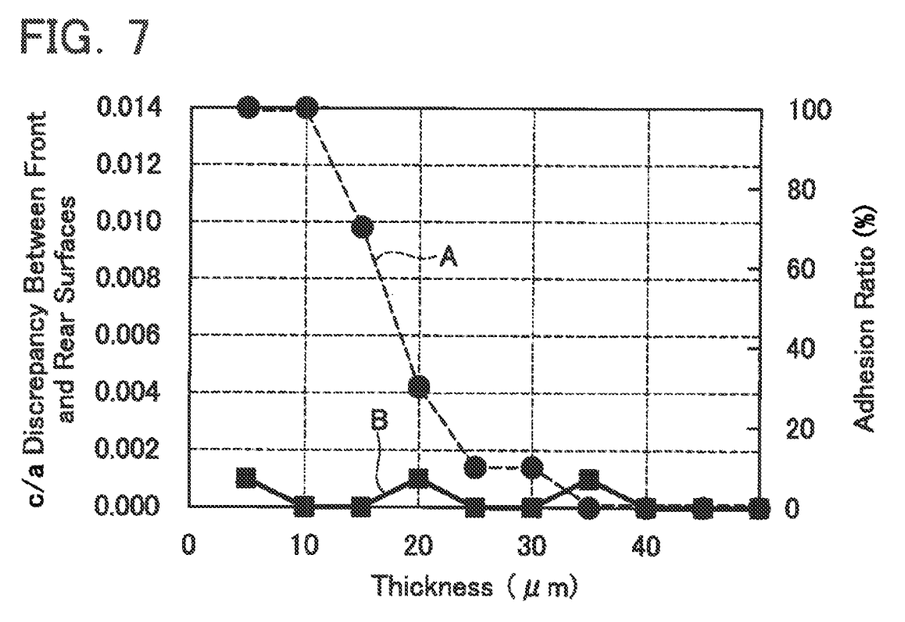
FIG. 7 is a figure showing evaluation results for $Pb_{1-y/2+x}(N_{1-y}Nb_y)O_{3+x}$ (where x=−0.003 and y=0.020)
Figure 8:
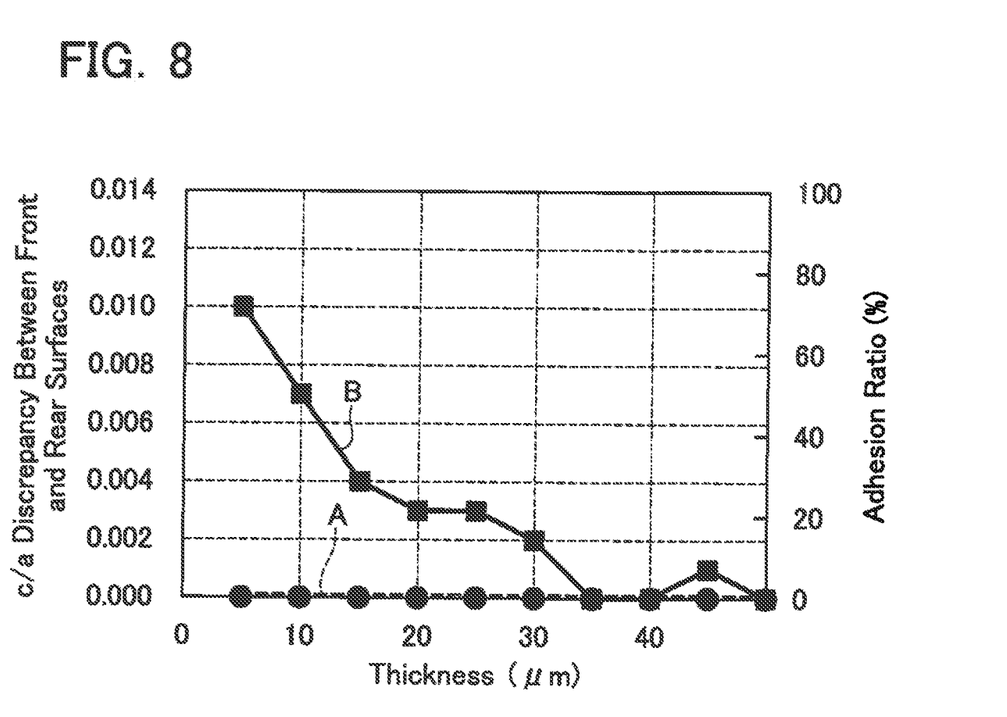
FIG. 8 is a figure showing evaluation results for $Pb_{1-y/2+x}(N_{1-y}Nb_y)O_{3+x}$ (where x=0.000 and y=0.000).

The inventors of the present application have discovered that, when an attempt is made to burn a piezoelectric substrate whose thickness is 30 μm or less upon a setter, the following two problems occur. The first problem is that the piezoelectric substrate adheres to the setter. If adhesion occurs, then the piezoelectric substrate may break when it is being removed from the setter. The other problem is that, at a contacting surface between the piezoelectric substrate and the setter, diffusion of atoms from the piezoelectric substrate into the setter may take place, and characteristics of piezoelectric elements become non-uniform (for example, the characteristics of a front surface and a rear surface of the piezoelectric substrate may become different). These two phenomena constitute problems, since they both exert a strong influence upon the characteristics of the piezoelectric substrate. Even though these two problems do not occur during burning of a piezoelectric substrate thicker than 30 μm, they appear if a piezoelectric substrate of thickness 30 μm or less is burned under the same conditions as the condition under which the piezoelectric substrate thicker than 30 μm is burned. For example, for piezoelectric substrates having various thicknesses that have been manufactured by burning green sheets having composition $Pb_{1-y/2+x}(N_{1-y}Nb_y)O_{3+x}$ (where N represents $Ti_{0.48}Zr_{0.52}$), results of evaluation of adhesion ratio and c/a discrepancy between their front and rear surfaces are shown in FIGS. 6 through 8 (a high c/a discrepancy between front and rear surfaces implies that diffusion of atoms from the piezoelectric substrate into the setter has occurred), Line A in FIGS. 6 through 8 show the adhesion ratio, while line B shows the c/a discrepancy between front and rear surfaces. FIG. 6 shows the evaluation results when x=0.0045 and y=0.020, FIG. 7 shows the evaluation results when x=−0.003 and y=0.020, and FIG. 8 shows the evaluation results when x=0.000 and y=0.000. In each of FIGS. 6 through 8, when the thickness of the piezoelectric substrate is greater than 30 μm, both the adhesion ratio and the c/a discrepancy have low values. However, when the thickness of the piezoelectric substrate is 30 μm or less, in FIGS. 6 and 8 the c/a discrepancy is elevated, and in FIG. 7 the adhesion ratio is elevated. Thus, these problems of adhesion and diffusion are problems that appear only when the piezoelectric substrate of thickness 30 μm or less is burned. The present inventors have discovered that a governing factor in these problems is to be found in composition of a piezoelectric element material, and have been able to conceive a method for manufacture disclosed below.

The method for manufacturing a piezoelectric substrate disclosed in this specification includes a process of forming a material having a composition $M_{1-y/2+x}(N_{1-y}Nb_y)O_{3+x}$ (where $0 \leq y \leq 0.045$, M represents $Pb_{1-p}Sr_p$ with $0 \leq p \leq 0.03$, and N represents $Ti_{1-q}Zr_q$ with $0.45 \leq q \leq 0.60$) into a sheet form, and a process of burning the material formed into the sheet form while mounted on a setter to obtain a piezoelectric substrate. A thickness of the piezoelectric substrate is 30 μm or less. A surface area/thickness ratio of the piezoelectric substrate is $1 \times 10^7$ μm or more. The variable x has a value within or on a boundary of a region R shown by hatching in FIG. 1.

The surface area/thickness ratio is a value obtained by dividing an area of the piezoelectric substrate (in $\mu m^2$) when seen in plan view by the thickness of the piezoelectric substrate (in μm).

Figure 1:
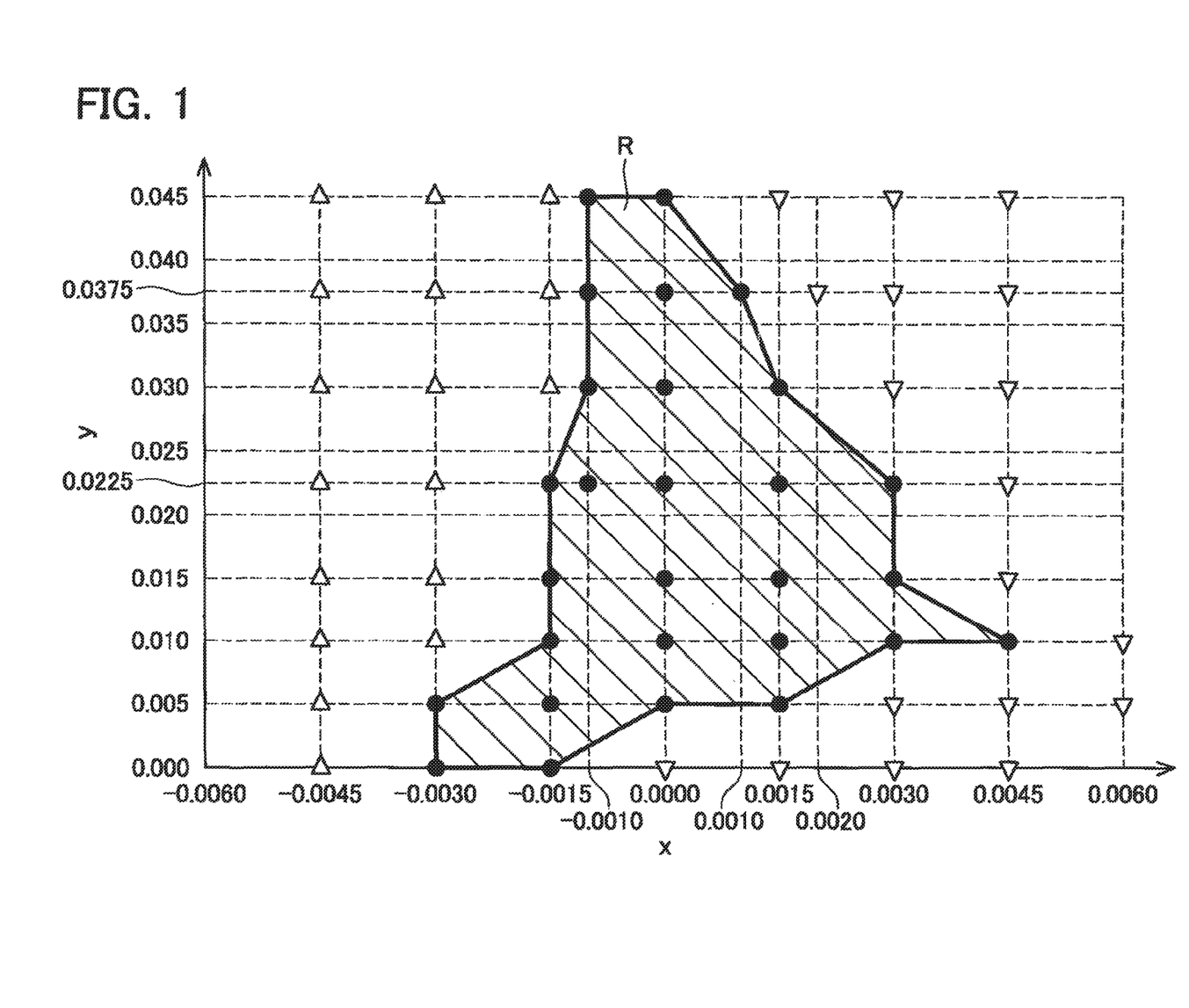
FIG. 1 is a figure showing evaluation results for piezoelectric substrates manufactured under various conditions.

FIG. 1 shows results of various experiments that have been performed by the inventors of the present application, all overlaid in the drawing discussed above. In FIG. 1, a symbol "Δ" (an upwardly pointing triangle) signifies that adhesion of the piezoelectric substrate to the setter occurred, a symbol "∇" (a downwardly pointing triangle) signifies that diffusion of atoms from the piezoelectric substrate into the setter occurred, and the symbol "●" (a black dot) signifies that neither of these phenomena occurred (in other words, it is possible to manufacture the piezoelectric substrate in a satisfactory manner). As shown in the figure, if the variables x and y have values within the hatched region R or on its boundary, neither the problem of adhesion nor the problem of diffusion occurs, and it is possible to manufacture a piezoelectric substrate having thickness 30 μm or less in a satisfactory manner. Further, whatever the values of the variables p and q may be provided that $0 \leq p \leq 0.03$ and $0.45 \leq q \leq 0.60$, it has been confirmed that a piezoelectric substrate having thickness 30 μm or less can be manufactured in a satisfactory manner, provided that the point specified by the variables x and y is within the hatched region R or upon its boundary. Thus, according to the technique described above, it is possible to manufacture a piezoelectric substrate having thickness 30 μm or less.

In the manufacturing method described above, the setter may be made of stabilized zirconia whose purity of 99.9 mol % or more. A weight density of Na in the setter may be 50 ppm or less. A weight density of Si in the setter may be 5 ppm or more and may be 50 ppm or less. Note that stabilized zirconia is a composite material in which 5 to 10 mol % of $Y_2O_3$ is added to $ZrO_2$.

DETAILED DESCRIPTION OF THE INVENTION

Figure 2:
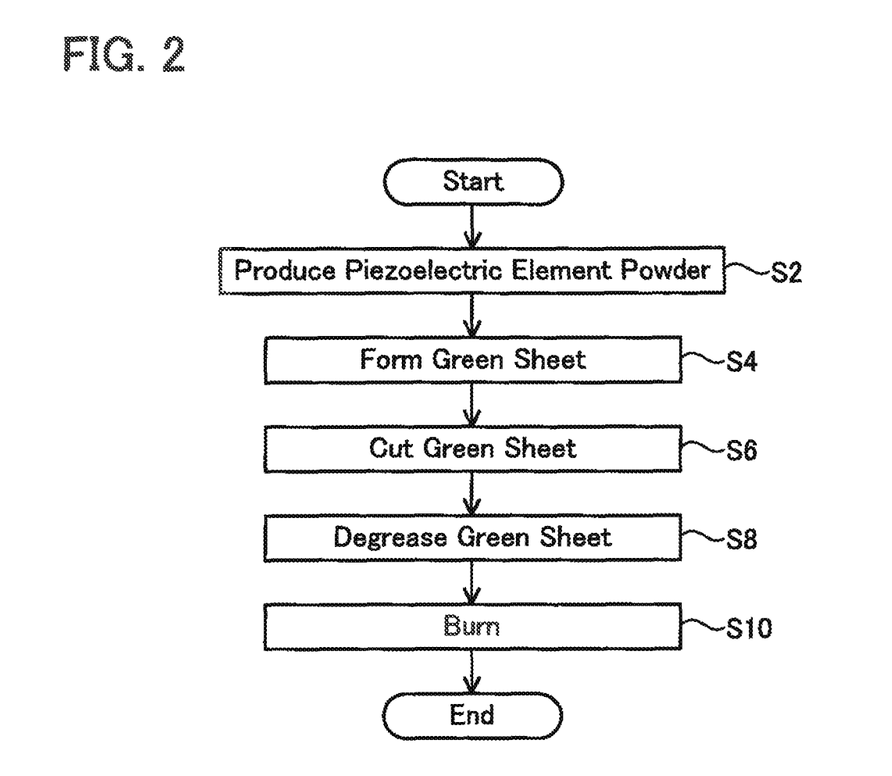
FIG. 2 is a flow chart showing an embodiment of a manufacturing method.

FIG. 2 shows a manufacturing method according to an embodiment. It is possible to manufacture a piezoelectric substrate having thickness of 30 μm or less with this manufacturing method. And it is possible to make ratio S/T between an area S (in μm$^2$) of the piezoelectric substrate that is manufactured and the thickness T (in μm) of the piezoelectric substrate be $1\times10^7$ (in μm) or greater. The area S of the piezoelectric substrate is the area of the piezoelectric substrate when seen in plan view. With the manufacturing method shown in FIG. 2, it is possible appropriately to manufacture this type of PZT piezoelectric substrate.

In step S2, a piezoelectric element powder (in other words, a powder that has a composition from which piezoelectric elements can be manufactured by sintering) is produced. For example, the piezoelectric element powder is produced by mixing powders of various materials together and applying heat to this mixed powder material. As a specific embodiment, for example, initially each of powder materials made of PbO, $SrCO_3$, $TiO_2$, $ZrO_2$, and $Nb_2O_5$ is finely wet milled by use of a ball mill or a bead mill or the like, and uniform particle diameters and uniform dispersion in a liquid of these powdered materials are achieved. Next, these powdered materials are dried, and then they are mixed together using a dry mill such as an atomizer or the like. Next, the mixed powder materials are calcined (i.e. combined together) at around 950° C. A combined piezoelectric element powder can be produced according to this type of procedure. In step S2, mixture ratio of the powdered materials in the combined piezoelectric element powder is adjusted so that it has a composition of $M_{1-y/2+x}(N_{1-y}Nb_y)O_{3+x}$. It should be understood that M represents $Pb_{1-p}Sr_p$, and N represents $Ti_{1-q}Zr_q$. A value of the variable p is adjusted within a range $0 \leq p \leq 0.03$. The reason for adjusting p within the range $0 \leq p \leq 0.03$ is that, if the variable p is greater than 0.03, then oxygen defects within the piezoelectric elements increase, and this invites increase of the particle diameter and deterioration of characteristics. Moreover, a value of the variable q is adjusted within a range $0.45 \leq q \leq 0.60$. The reason for adjusting q to have a value greater than or equal to 0.45 is in order to prevent increase of the particle diameter. Furthermore, the reason for adjusting q to have a value less than or equal to 0.60 is in order to prevent decomposition of PbO during burning, and in order to produce a piezoelectric element that is made of perovskite structure. It should be understood that it is more desirable for the value of the variable q to be in the range $0.51 \leq q \leq 0.55$. According to this type of structure, since the piezoelectric element after burning has a composition that is close to an MPB (i.e. the morphotropic phase boundary), it is possible to manufacture a piezoelectric substrate that has a high piezoelectric constant. And it is even more desirable that q should be in the range $0.51 \leq q \leq 0.53$. According to this type of composition, the piezoelectric element after burning has a tetragonal crystalline structure, and the amount of electric field-induced distortion of the piezoelectric substrate when a high electric field is applied becomes greater. Since it is easy to apply a high electric field to a piezoelectric substrate that is as thin as 30 μm or less, it is desirable for the amount of electric field-induced distortion when the high electric field is applied to be high. However, these values of the variable q are values that are appropriate when attention is particularly concentrated upon the amount of electric field-induced distortion when the high electric field is applied. If attention is principally directed to adhesion to the setter during manufacture and to diffusion of atoms between the setter and the piezoelectric substrate, then it is sufficient for the variable q to satisfy the condition that, at least, $0.45 \leq q \leq 0.60$.

Now, the variables x and y will be explained. A piezoelectric element made of the composition $M_{1-y/2+x}(N_{1-y}Nb_y)O_{3+x}$ (where M represents $Pb_{1-p}Sr_p$ and N represents $Ti_{1-q}Zr_q$) has a perovskite structure. This composition is one in which Sr, Nb, and PbO are added to $Pb(Ti_{1-q}Zr_q)$. $Pb(Ti_{1-q}Zr_q)$ is the composition of a common PZT. The variable x denotes the amount of added PbO, while the variable y denotes the amount of added Nb. Notably, the reason for appending the added symbols "−y/2" to M is that because Nb is pentavalent, defects of −y/2 are formed at the site of M which is bivalent. If the defect is denoted by α, then M in the composition described above may also be expressed as $(Pb_{1-p}Sr_p)_{1-y/2+x}\alpha_{y/2}$. As will be described hereinafter, the variables x and y are adjusted so that their values lie within or on a boundary of a hatched region R shown in FIG. 1.

Next, in step S4, a green sheet is formed using the piezoelectric element powder that was combined in step S2. For example, such a green sheet may be formed according to the following procedure. First, a solvent, a dispersant, a binder, and a plasticizer are added to the combined piezoelectric powder, and they are wet mixed by using a ball mill, a bead mill, or the like. Next, the mixed material is applied upon a PET film by a doctor blade method to form a green sheet. At this time, the green sheet is made to have a thickness of 38 μm or less. If it is ensured that the thickness of the green sheet is 38 μm or less in this manner, then the thickness of the piezoelectric substrate after burning will be 30 μm or less.

Next, in step S6, the green sheet manufactured in step S4 is cut. For example, the green sheet may be cut into squares having sides around 40 mm. A per se known method may be used for cutting up the green sheet. Further, when making the green sheet, if the mixed material has been applied over a PET film as described above, then the green sheet may be cut together with the PET film. And the green sheets may be detached from the PET film after cutting.

Next, in step S8, the green sheet is degreased. This degreasing of the green sheet may, for example, be performed according to the following procedure. That is, initially, the green sheet is placed upon a setter that is made from stabilized zirconia having purity of 99.9% or greater. Next, a porous setter is placed upon the green sheet. In other words, the green sheet is sandwiched between two setters. In this state, heat at 500° C. is applied to the green sheet while ventilation to the exterior atmosphere is provided. This is how the green sheet is degreased. If the green sheet is degreased while a porous setter is loaded upon the green sheet in this manner, then it is possible to prevent the green sheet from bending during the degreasing process. Furthermore, since the setter that is loaded upon the green sheet is porous, accordingly the gas evolved from the green sheet during degreasing is emitted to the exterior via the open holes internal to the porous setter. Therefore it is possible to perform degreasing in an appropriate manner. Notably, it is desirable to employ a porous setter of a suitable weight, since in some cases the green sheet may be fractured if the porous setter is too heavy. It should be understood that, when the green sheet has been degreased with a porous setter loaded upon the green sheet, then the porous setter that was loaded upon the green sheet should be removed after the degreasing process. The processes of the steps S2 through S8 explained above correspond to the process of forming a material having composition $M_{1-y/2+x}(N_{1-y}Nb_y)O_{3+x}$ into sheet form.

Figure 3:
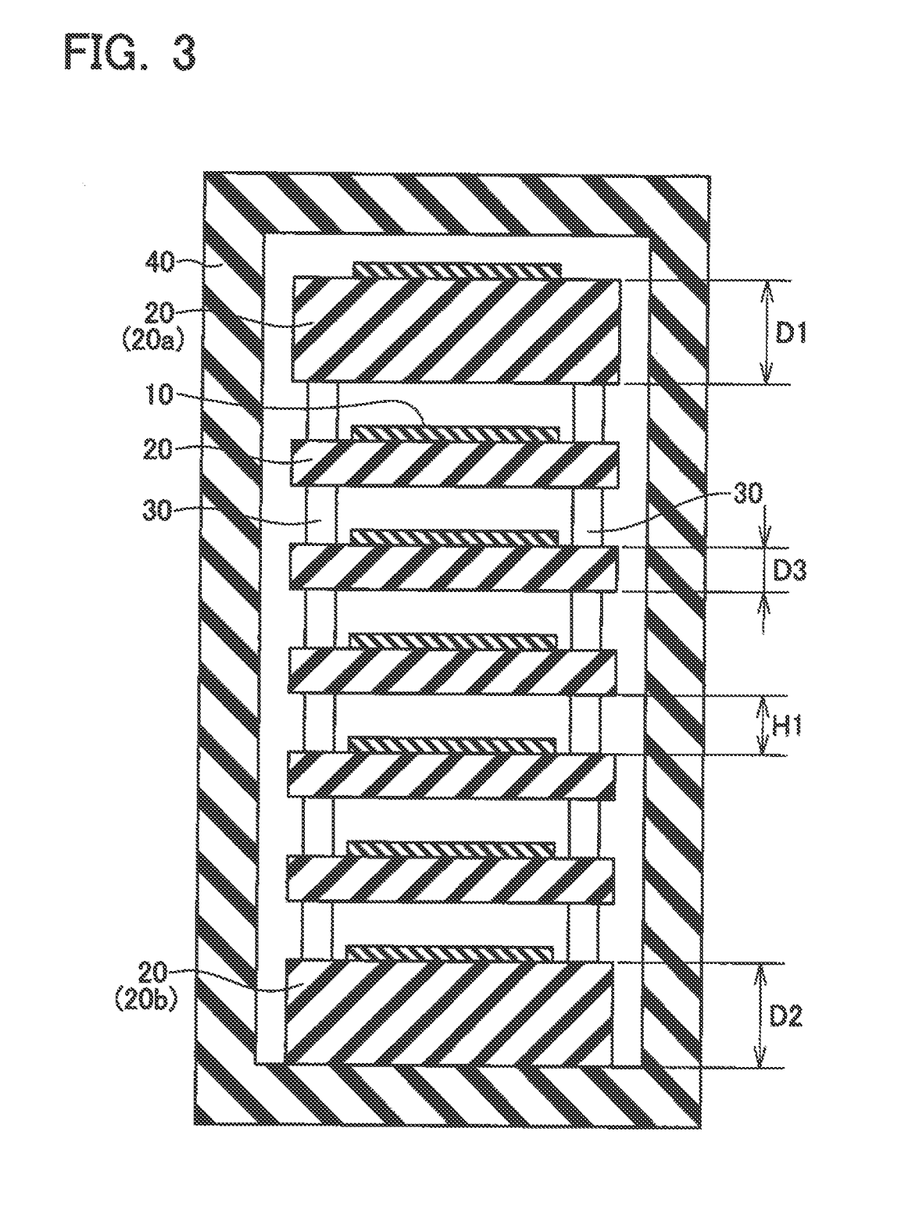
FIG. 3 is a vertical sectional view showing setters 20 and green sheets 10 set up in an interior of a case 40.
Figure 4:
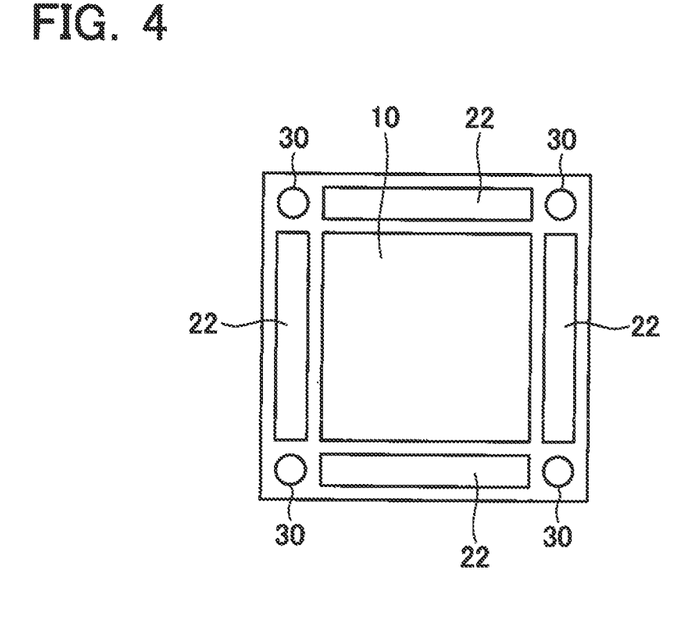
FIG. 4 is a plan view showing how several elements are set up on a setter 20.

Next, in step S10, heat is applied to the degreased green sheet to burn the piezoelectric substrate. In other words, a plate shaped piezoelectric substrate is obtained by sintering the piezoelectric element powder within the green sheet and making it into a ceramic. Burning of the piezoelectric substrate can, for example, be performed according to the following procedure. That is, first, as shown in FIG. 3, a plurality of setters 20 that are made of stabilized zirconia upon which a degreasing process has been completed are stacked within the interior of a case 40 made of MgO, each setter having a green sheet 10 loaded upon it. Moreover, four spacers 30 are arranged upon each of the setters 20 as shown in FIG. 4, so as to ensure adequate space between the green sheet 10 and the setter 20 above it, as shown in FIG. 3. Furthermore, as shown in FIG. 4, upon each setter 20, in addition to the green sheet 10, dummy sheets 22 manufactured by a process substantially same as that for manufacturing the green sheet 10 may be arranged around the green sheet 10. It is desirable for these dummy sheets 22 to have the same composition as the green sheets 10. Next, a powder for adjusting the atmosphere internal to the case during burning is disposed in the interior of the case by being placed in a dish made from MgO (this is omitted from the drawings). In this state the case is sealed, and heat is provided to the interior of the case. Due to this, the piezoelectric element powder within the green sheets is sintered, and plate shaped piezoelectric substrates are perfected. Notably, the thickness of the green sheets diminishes during burning. Since the thickness of the green sheets before burning is no more than 38 µm, accordingly the thickness of the piezoelectric substrates is 30 µm or less after burning. Moreover, while before burning the green sheets are squares around 40 mm on each side, this dimension also shrinks during burning. After burning, the piezoelectric sheets become squares around 32 mm on each side. Therefore the surface area/thickness ratio of the piezoelectric substrates after burning is around $3 \times 10^7$ µm (in other words, $1 \times 10^7$ µm or greater). Further, while the burning temperature is not particularly limited, it should be set appropriately according to the composition of the piezoelectric element powder, its particle diameter, the required density for the piezoelectric substrate after burning, and so on. For example, in the case of manufacturing a dense piezoelectric substrate that is to have a theoretical density of 95% or greater from the composition described above, the burning may be performed in the temperature range of 1175° C. to 1250° C. If the temperature is below 1175° C. then the resultant density is inferior, while if it is above 1250° C. then the particles grow anomalously upon burning or it is impossible to prevent decomposition of the Pb and abnormalities may precipitate.

Notably, if dummy sheets 22 having the same composition as the green sheets 10 are disposed around the green sheets 10 as described above, then it is possible to enhance the density of the PbO gas around the green sheets 10 during burning. Due to this, it is possible to prevent PbO from escaping from the green sheets 10, and to suppress bending of the green sheets 10.

Moreover, if a gap H1 between the setters 20 shown in FIG. 3 is too narrow, then, when bending of the setters 20 takes place during burning, the green sheets 10 contact the setters 20 above them, and the green sheets 10 are deformed. Moreover, if the gap H1 between the setters 20 shown is too wide, then the spaces above the green sheets 10 become wide, and the density of the PbO gas around the green sheets 10 becomes unstable, so that bending of the green sheets 10 occurs. Accordingly, it is preferable for the gap H1 between each pair of setters 20 to be at least 30 µm and not more than 200 µm, and it is more preferable for this gap to be at least 50 µm and not more than 150 µm.

Furthermore, as shown in FIG. 3, it is desirable for a thickness D1 of the uppermost setter 20a and a thickness D2 of the lowermost setter 20 to be at least twice a thickness D3 of the other setters 20. If such a thick and heavy setter 20a is arranged at the top, then the setters 20 below it is pressed down and held in place by the weight of this setter 20a. Due to this, it is possible to prevent bending of the setters 20 during burning. Moreover, by making the lowermost setter 20b thick, it is possible for the setter 20b to bear the load upon the setters 20 above it without being deformed. It is possible to prevent bending of the green sheets 10 by suppressing bending of the setters 20 in this manner.

Moreover, in the method for manufacture described above, it is desirable for a center line average roughness Ra that specifies the surface roughness of the upper surface of the setters 20 to be 0.02 µm~5 µm, and for their maximum height Rmax to be 10 µm or less. For achieving this, it is desirable to manufacture the setters 20 by forming sheets using $ZrO_2$ powder material of particle diameter 0.5 µm~1.5 µm, and by burning these sheets. By making the setters 20 in this manner, it is possible to ensure an appropriate value for the surface roughness of the setters 20. If the upper surfaces of the setters 20 are processed by grinding or blast processing, it is difficult to make the maximum height Rmax small, so this procedure is not desirable. Moreover, with regard to the amounts of impurities in the setters 20, it is desirable for a Na content to be no more than 50 ppm, and for a Si content to be no more than 50 ppm. This is because, if the amount of Na or Si is too great, then it becomes easy for mutual diffusion to take place between the setters 20 and the green sheets 10. Moreover, it is desirable for the amount of Si included in the setters 20 to be 5 ppm or greater. This is because, if the amount of Si is too small, then the density of the setters 20 becomes low, so that it is easy for PbO to get into the setters 20, and for the density of the PbO gas in the ambient atmosphere to change.

According to the method for manufacture described above, it is possible to manufacture a piezoelectric substrate having composition $M_{1-y/2+x}(N_{1-y}Nb_y)O_{3+x}$ (where M represents $Pb_{1-p}Sr_p$ and N represents $Ti_{1-q}Zr_q$) in an appropriate manner. In other words, according to this method of manufacture, it is possible, while preventing adhesion between the piezoelectric substrate and the setter, also to prevent diffusion of atoms from the piezoelectric substrate (in other words, from the green sheet) into the setter during burning. Due to this, it is possible to ensure uniformity of composition within the piezoelectric substrate. Furthermore, since it is possible to prevent diffusion of atoms in this manner, accordingly it is possible to manufacture a piezoelectric substrate in which there is almost no difference in particle diameter between its front surface and its rear surface. Notably, the front surface of the piezoelectric substrate means the surface that does not contact the setter during burning (in other words, its upper surface), while the rear surface of the piezoelectric substrate means the surface that contacts the setter during burning (in other words, its lower surface). In more specific terms, according to this method of manufacture, it is possible to manufacture a piezoelectric substrate for which a difference between average values of particle diameter for the front surface and for the rear surface is within 10% of the average value for the front surface, and the difference between standard deviations of the particle diameter for the front surface and for the rear surface is within 10% of a standard deviation for the front surface. After having manufactured a piezoelectric substrate by using this method, subsequently electrodes are formed on both sides of the piezoelectric substrate, and then the piezoelectric substrate is cut into a predetermined shape. As a result, the piezoelectric substrate can be used as a piezoelectric element. Moreover, by connecting the piezoelectric substrate to a circuit board so that it is possible to apply a voltage between the electrodes formed on its both sides, it can also be used as a piezoelectric actuator, a sensor, an ultrasonic motor, or the like. In particular, since it is possible to apply a high electric field to this piezoelectric substrate which is very thin as described above, accordingly a piezoelectric element that is manufactured from this piezoelectric substrate can be made more compact, and can be used in an appropriate manner for an application in which a high amount of displacement is required. Furthermore, since it is possible to manufacture a large piezoelectric substrate according to this method of manufacture, therefore it is possible to divide it up into a large number of piezoelectric elements, and accordingly it becomes possible to manufacture these piezoelectric elements at low cost.

Moreover, according to the method for manufacture described above, it is possible to manufacture a piezoelectric substrate by burning whose thickness is 30 μm or less. In other words it is possible to obtain a thin piezoelectric substrate without performing any surface polishing or the like (in other words, without performing any thickness reduction processing) upon the piezoelectric substrate. Accordingly, this method of manufacture is able to produce thin piezoelectric substrates with excellent production efficiency. Furthermore, with a piezoelectric substrate manufactured in this manner, both its front surface and its rear surface are burned surfaces (i.e., surfaces of the piezoelectric substrate that are exposed during burning). On a burned surface, minute concavities and convexities are present that originate in the diameter of the particles of the piezoelectric material of which the piezoelectric substrate is made. Due to this, when electrodes are being formed upon the surfaces of the piezoelectric substrate, the adherence of the electrodes to the piezoelectric substrate is high.

Embodiments

In the following, specific embodiments will be explained. It should be understood that the embodiments described below are only specific examples for explanation of the technique disclosed herein, and are not limitative of the technique disclosed herein in any way.

Piezoelectric element powders were combined using various different values for x and y, and piezoelectric substrates were manufactured by burning these combined piezoelectric element powders at 1200° C. for three hours. The manufacturing method described above was used for manufacturing those piezoelectric substrates. The manufactured piezoelectric substrates are square in shape with sides of about 40 mm, and have thickness about 15 μm. For all of these piezoelectric substrates manufactured in this way, q=0.525 and p=0.02. Further, with q=0.525, the crystal lattice of the piezoelectric elements was tetragonal.

Figure 5:
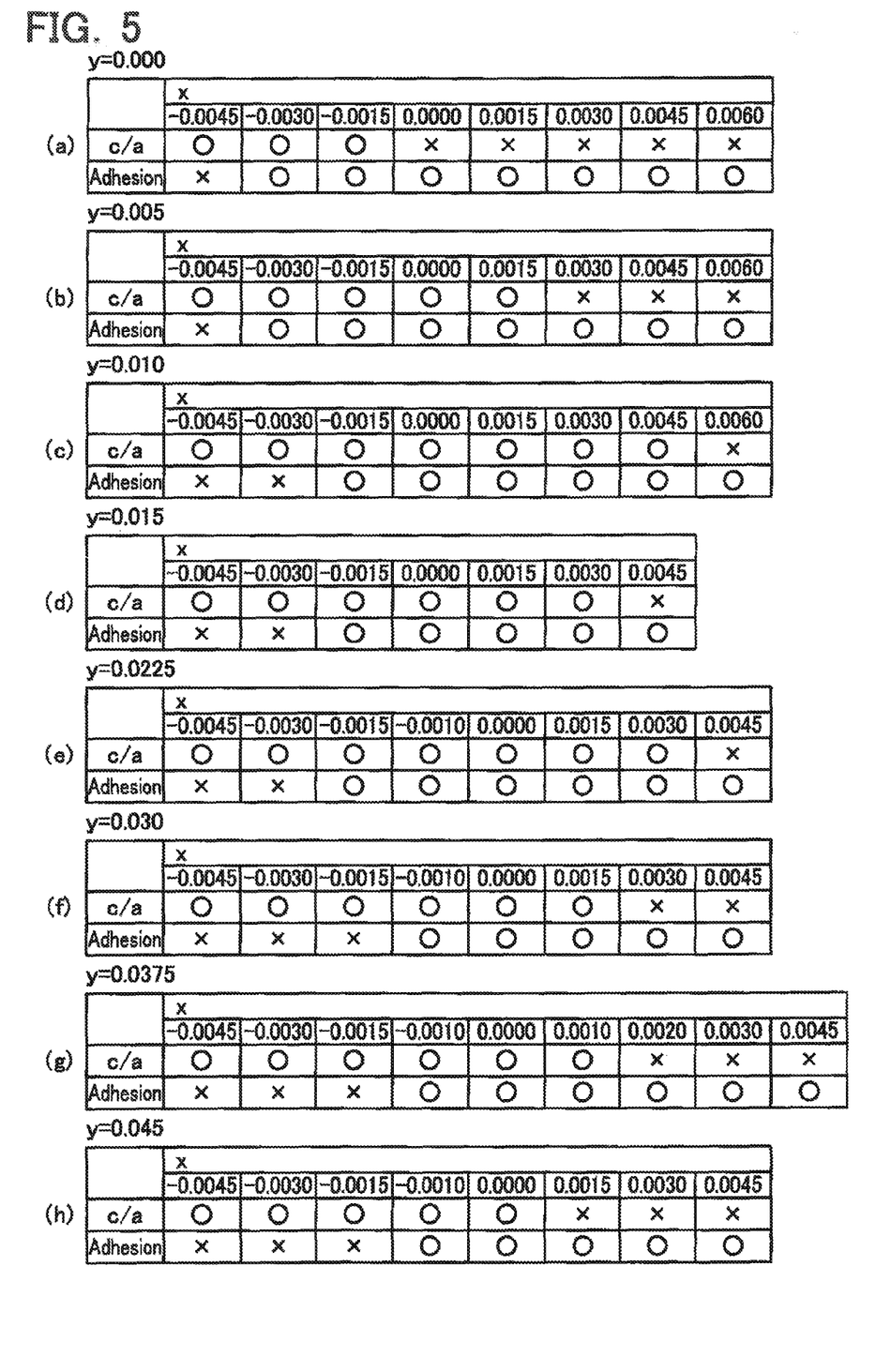
FIG. 5 is a figure showing evaluation results for various conditions.

The adhesion to the setter and the c/a discrepancy between front and rear surfaces were evaluated for each of the manufactured piezoelectric substrates. FIG. 5 shows, for each of these piezoelectric substrates, the results of evaluation of the adhesion and the c/a discrepancy. Adhesion in FIG. 5 means that the piezoelectric substrate adhered to the setter during the burning step of S10. After the burning in step S10, the presence or absence of adhesion was determined by checking whether or not the piezoelectric substrate moved when pushed. An "O" for the adhesion evaluation result signifies that, for all of the ten sheets that were tested, no adhesion had occurred with any of them, while an "X" evaluation result signifies that adhesion had occurred in the case of at least one of the sheets.

Moreover, the c/a discrepancy between the front and rear surfaces means the discrepancy in c/a between the front surface of the piezoelectric substrate and its rear surface. Here, c/a is the axial ratio of the tetragonal crystal lattice of the piezoelectric element (i.e. the value obtained by dividing the length "c" of its axis that is not a side of a square by the length "a" of its axis that is one side of a square). In the evaluation of FIG. 5, it was determined whether or not the discrepancy in c/a between front and rear surfaces was greater than 0.001 (in other words, whether or not there was such a discrepancy in c/a between the front and the rear surfaces of the piezoelectric substrate). An "O" for the result of evaluation of the c/a discrepancy means that the c/a discrepancy was 0.001 or less, while an "X" means that the c/a discrepancy was greater than 0.001. It should be understood that, since the error in the measurement of c/a is around 0.001, the fact that the c/a discrepancy is 0.001 or less means that no measurable discrepancy is present. If diffusion of Ti takes place from the piezoelectric substrate to the setter during burning, then the value of c/a on the rear side portion of the piezoelectric substrate changes. Accordingly, in this case, the c/a discrepancy becomes great. It is not desirable for the c/a discrepancy to be great, because in that case the piezoelectric constant undesirably becomes different between the front surface and the rear surface. As a result, the piezoelectric element deforms so as to warp when voltage is applied. Further, c/a is calculated from the relative X-ray diffraction intensity ratio between the (200) surface and the (002) surface. The X-ray diffraction device used is an X'pert MPD Pro made by Spectris plc, the X-ray source is CuKα, the acceleration voltage is 45 kV, measurement is performed over the range of 40° to 50° by the θ/2θ method, and the measurement time period is set so that the main peak became 100,000 counts or more so that the accuracy is high.

FIG. 1 is a figure showing the results of evaluation in FIG. 5 in graphical form. In FIG. 1, the symbol "Δ" (an upwardly pointing triangle) signifies that adhesion occur, the symbol "∇" (a downwardly pointing triangle) signifies that the c/a discrepancy is large, and the symbol "●" (a black dot) signifies that neither of these phenomena occur (in other words, that it is possible to manufacture the piezoelectric substrate in a satisfactory manner). As shown in this figure, there is a tendency for adhesion to occur more easily, the smaller the variable x is, and there is a tendency for the c/a discrepancy to become large easily, the larger the variable x is. However, these problems do not occur when it is ensured that the variable x has an appropriate value. The appropriate range for the variable x changes according to the value for the variable y. In other words it will be understood that, by adjusting the value of the variable y within the range $0 \leq y \leq 0.045$, and by adjusting the variable x to a value that is within the range shown by the hatched region R in FIG. 1 or upon its boundary, the problems of adhesion and of diffusion of Ti do not occur, so that it is possible to manufacture a piezoelectric substrate in an appropriate manner.

Notably, while FIG. 1 shows results when p=0.02 and q=0.525, it is understood that, whatever values the variables p and q have, provided that the variable p is within the range 0≤p≤0.03 and the variable q is within the range 0.45≤q≤0.60, and provided that the variables x and y are within the range of the hatched region R, it is possible to manufacture a piezoelectric substrate of thickness 30 μm or less in an appropriate manner (in other words, no problem of adherence occurs, and moreover fluctuations of the axial ratio of the crystal lattice do not occur).

While specific examples of the technique disclosed herein have been explained in detail above, these have only been given by way of example, and are not to be considered as limitative of the Claims. Various alterations and changes to the specific examples shown above are also to be considered as being included in the technique described in the Claims. The technical factors explained in this specification and in the drawings are capable of providing technical utility either singly or in various combinations, and are not limited to being combined as described in this application or in the Claims at the filing date. Furthermore, the techniques shown by way of example in this specification and in the drawings are capable of attaining a plurality of objectives simultaneously, and also have individual technical utility for attaining those objectives singly.

The invention claimed is:

1. A method for manufacturing a piezoelectric substrate, the method comprising:

forming a material having composition $M_{1-y/2+x}(N_{1-y}Nb_y)O_{3+x}$, where 0≤y≤0.045, M represents $Pb_{1-p}Sr_p$ with 0≤p≤0.03, and N represents $Ti_{1-q}Zr_q$ with 0.45≤q≤0.60, into a sheet form; and burning the material formed into the sheet form while mounted on a setter made of stabilized zirconia to obtain a piezoelectric substrate, a thickness of the piezoelectric substrate being 30 μm or less, and a surface area/thickness ratio of the piezoelectric substrate being $1×10^7$ μm or more;

wherein the variable x has a value within or on a boundary of a region R shown by hatching in FIG. 1.

2. The method of claim 1, wherein the setter is made of stabilized zirconia having a purity of 99.9 mol % or more, and a weight density of Na in the setter is 50 ppm or less, and a weight density of Si in the setter is 5 ppm or more and is 50 ppm or less.

* * * * *